US008869082B2

(12) United States Patent
Bergler et al.

(10) Patent No.: US 8,869,082 B2
(45) Date of Patent: Oct. 21, 2014

(54) METHOD AND DEVICE FOR CHECKING A CIRCUIT FOR ADHERENCE TO SET-UP AND HOLD TIMES

(75) Inventors: Stefan Bergler, München (DE); Alfred Lang, Weilheim (DE)

(73) Assignee: Infineon Technologies AG, Munich (DE)

( * ) Notice: Subject to any disclaimer, the term of this patent is extended or adjusted under 35 U.S.C. 154(b) by 183 days.

(21) Appl. No.: 11/226,514

(22) Filed: Sep. 13, 2005

(65) Prior Publication Data

US 2006/0117287 A1 Jun. 1, 2006

(30) Foreign Application Priority Data

Sep. 15, 2004 (DE) .................... 10 2004 044 668

(51) Int. Cl.
*G06F 17/50* (2006.01)
(52) U.S. Cl.
CPC .................... *G06F 17/5031* (2013.01)
USPC ........................................ 716/108
(58) Field of Classification Search
USPC ....................................... 716/1–18
See application file for complete search history.

(56) References Cited

U.S. PATENT DOCUMENTS

| 6,249,901 | B1 | 6/2001 | Yuan et al. | |
| 6,427,226 | B1 * | 7/2002 | Mallick et al. | 716/10 |
| 6,584,598 | B2 * | 6/2003 | Rao et al. | 716/2 |
| 2003/0056185 | A1 * | 3/2003 | Nakajima | 716/5 |
| 2003/0212972 | A1 | 11/2003 | Tran | |
| 2004/0060012 | A1 | 3/2004 | Lu et al. | |
| 2004/0254776 | A1 * | 12/2004 | Andou | 703/19 |
| 2005/0114811 | A1 * | 5/2005 | Schultz | 716/6 |
| 2005/0149895 | A1 * | 7/2005 | Toubou | 716/6 |
| 2005/0246599 | A1 * | 11/2005 | Simpson et al. | 714/724 |

OTHER PUBLICATIONS

German Office Action Serial No. 10 20040044 668.7-53, Dated Oct. 19, 2005 and English Translation.

* cited by examiner

*Primary Examiner* — Vuthe Siek
*Assistant Examiner* — Aric Lin
(74) *Attorney, Agent, or Firm* — Eschweiler & Associates, LLC

(57) ABSTRACT

A method and a device for checking a circuit path of a circuit for adherence to set-up and hold times are provided. A timing behavior of the circuit path is designated as being correct if at least one pair of set-up and hold times from predefined set-up and hold times that are for the circuit path does not produce any timing infringement in the circuit path. Otherwise, the timing behavior of the circuit path is classified as being defective. This decreases the number of circuit paths wrongly designated as being defective by the use of pairs of predefined set-up and hold times and decreases the chip area for buffers.

6 Claims, 7 Drawing Sheets

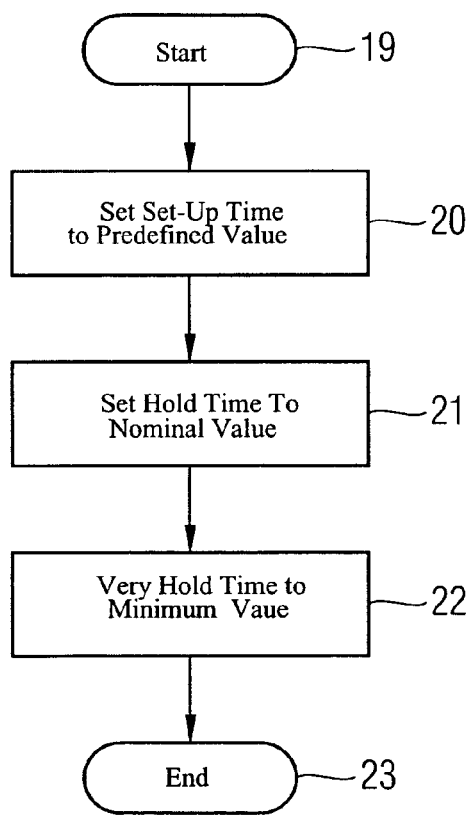
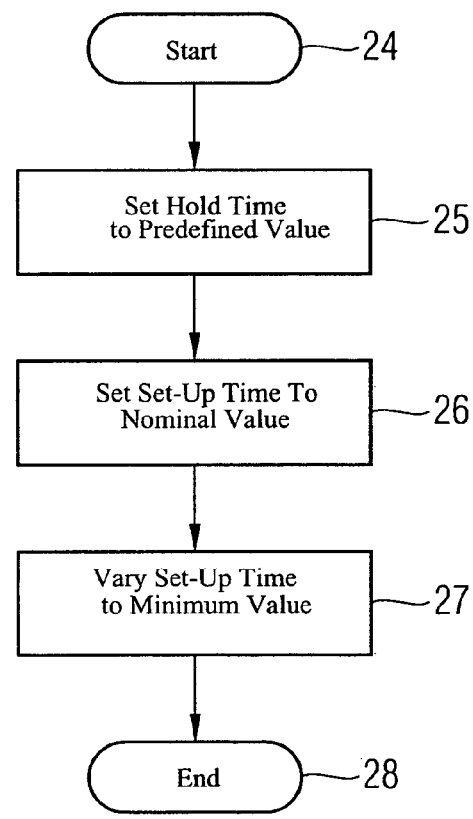

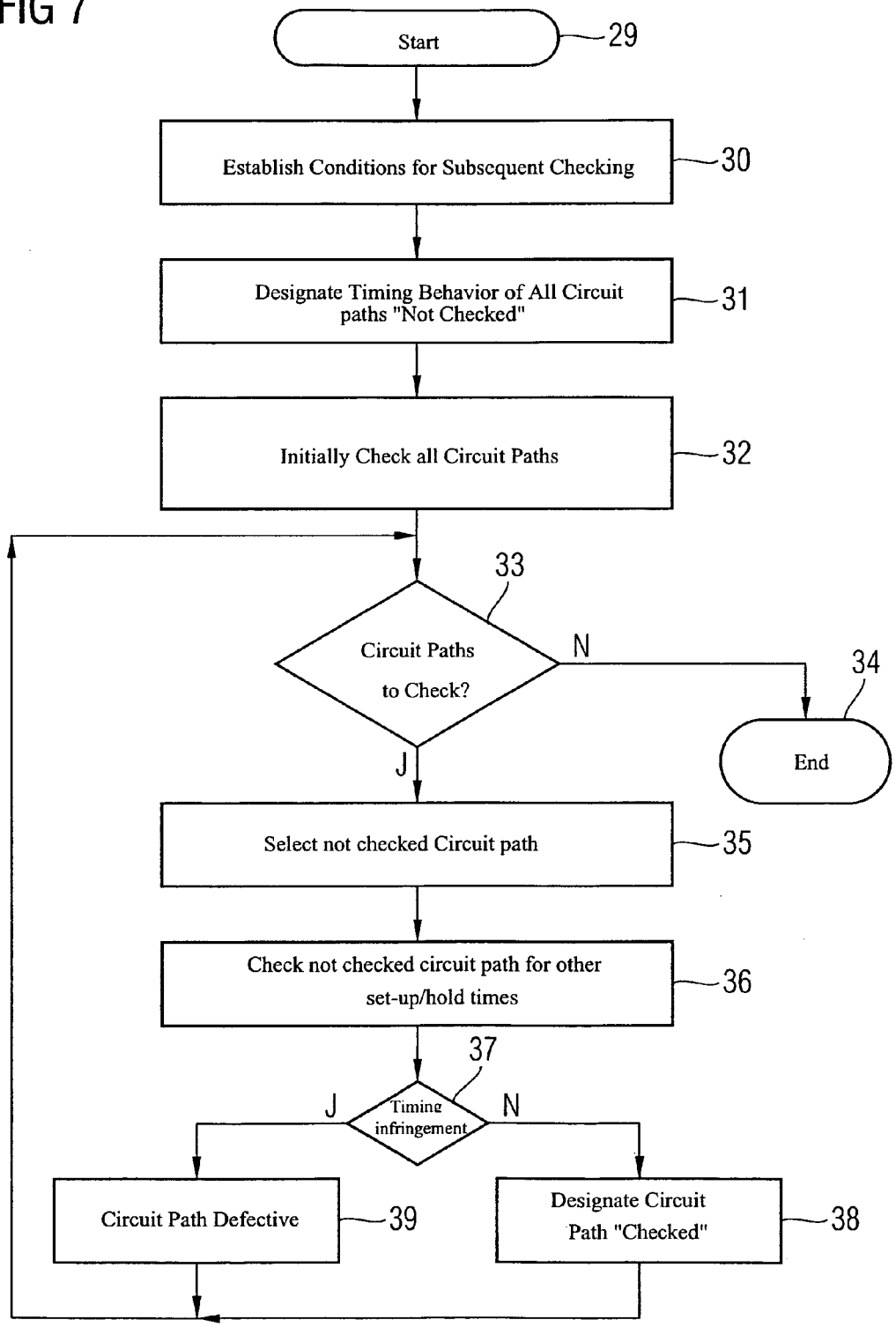

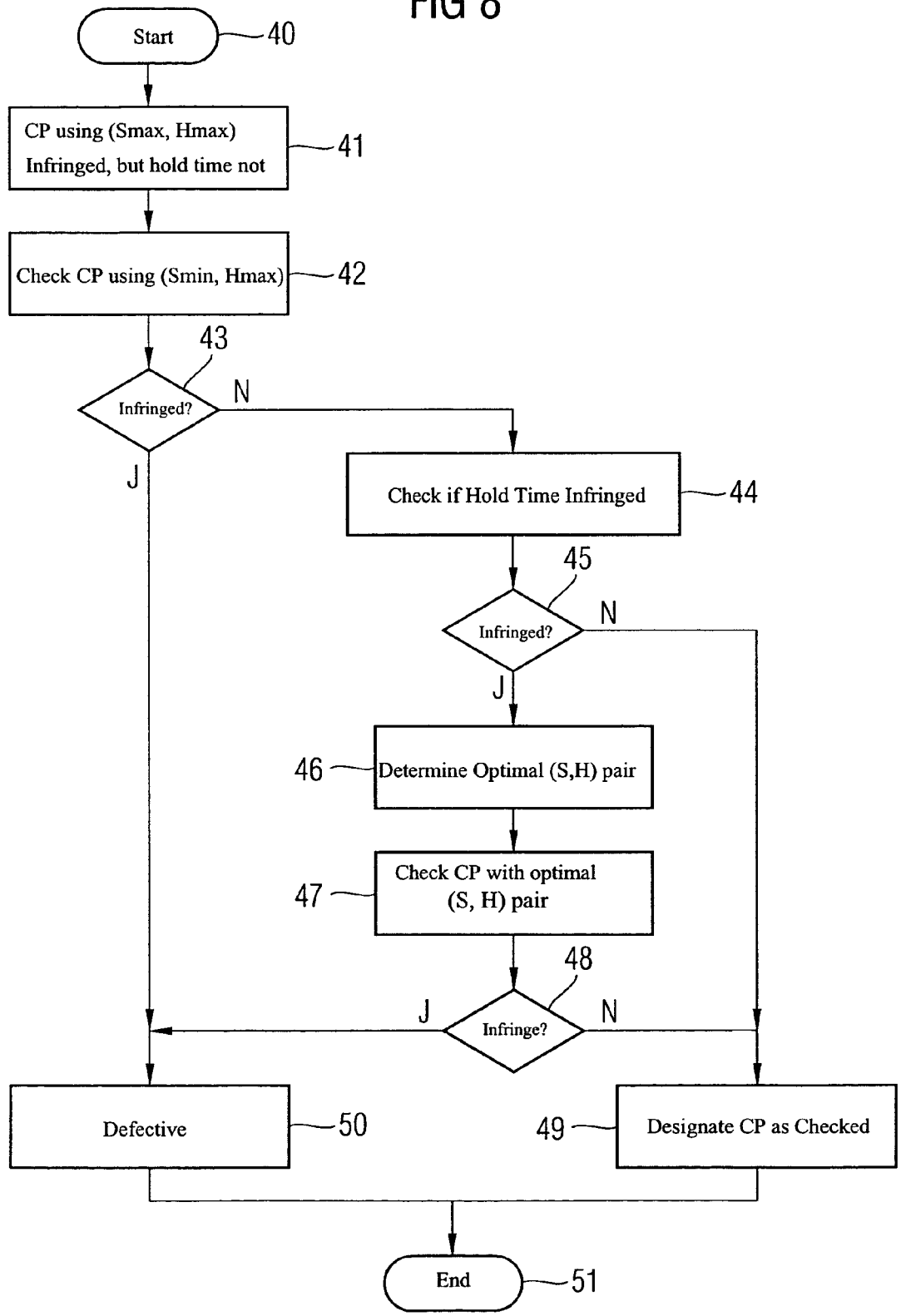

METHOD AND DEVICE FOR CHECKING A CIRCUIT FOR ADHERENCE TO SET-UP AND HOLD TIMES

PRIORITY CLAIM

This application claims the benefit of priority to German Patent Application DE 10 2004 044 668.7 filed on Sep. 15, 2004, herein incorporated by reference in its entirety.

TECHNICAL FIELD

The present application relates to a method and a device for checking a circuit. More specifically, the present application relates to a method and a device for checking a circuit such as an integrated circuit for adherence to set-up and hold times.

BACKGROUND

First of all, the terms "set-up time" and "hold time", such as they are used below, will be explained with reference to a flip-flop.

FIG. 10 illustrates a flip-flop 57. The flip-flop comprises a data input D for a data signal d, an output Q for an output signal q and a clock input for a clock signal c. The data signal d is scanned as a function of the clock signal c and a corresponding value issued as the output signal q.

This is illustrated schematically in FIG. 11. FIG. 11 shows, by way of example, one possible time characteristic of the signals d, c and q, wherein t denotes time. The clock signal c is a periodic signal, wherein for each rising edge of the clock signal c, the flip-flop 57 from FIG. 10 scans the data signal d and issues the corresponding value of the data signal d with a given component-dependent delay as the output signal q. A scanning process of this type takes place, for example, at moment t0. In order to ensure correct scanning of the data signal d, it is necessary that the data signal d to be scanned is "valid" for a given period ts before the scanning moment t0 and for a given period th after the scanning moment t0, i.e., does not exhibit a signal change beyond a particular threshold. In the example shown in FIG. 11, this is the case, and after a given delay time after the moment t0 the scanned value of the data signal d is issued as a new value of the output signal q. If, on the other hand, the illustrated signal change of the data signal d were to take place within the period ts or within the period th, this might result in defective scanning and hence in a defective output signal q. The period ts will be referred to below as the set-up time, the period th as the hold time.

Although the set-up and hold times have been explained, in this case, using the example of a flip-flop, adherence to such set-up and hold times is generally necessary in the case of circuit paths in which a data signal is processed as a function of a clock signal.

Modern integrated circuits, for example digital VLSI ("very large-scale integration") circuits, conventionally comprise a large number of circuit paths of this type, in which set-up and hold times have to be adhered to for correct functionality of the circuit.

In the design of such circuits, what is known as a timing analysis, in which adherence to the set-up and hold times is checked in a circuit design, is therefore carried out. The circuit is provided in the form of a machine-readable description, for example in the form of what is known as a NetList, and is checked by means of what is known as EDA ("Electronic Design Automation") software.

Respective set-up and hold times, which are to be adhered to, may thus be specified for each circuit path to be checked, i.e., for example, for each flip-flop or other element comprising a clock input and a data input. These set-up and hold times may optionally be predefined as a function of conditions under which the circuit operates, for example as a function of a temperature of the circuit, as a function of a clock frequency of the circuit or as a function of applied voltages, wherein these parameters may influence the necessary set-up and hold times.

These set-up and hold times to be predefined must accordingly be selected such that these values guarantee functioning of the circuit irrespective of the actual subsequent use and the circumstances thereof. In particular, the values of the set-up and hold times for each circuit path must be selected such that the circuit still functions even if both the set-up time and the associated hold time are borderline.

According to an approach known from the prior art, the shortest possible set-up time and a correspondingly required hold time associated with this shortest possible set-up time are used for each circuit path. This is also known as the "worst case". It should be noted that the set-up and hold times required for the correct operation of a circuit path are independent of each other, i.e. within given limits, a relatively short set-up time may be compensated by a relatively long hold time and vice versa.

Although these predefined values allow the maximum possible performance on paths that are critical with respect to the set-up time, to be realistically calculated, there is nevertheless the drawback that an excessively long hold time must be allowed for on paths in which even a relatively long set-up time would be possible, i.e. which are not borderline with respect to the set-up time. If this long hold time is not adhered to with an existing circuit design, additional delay members (buffers) have to be provided in the design of the circuit, in what is known as "hold time fixing", i.e. in the correction of circuit paths in which the hold time is infringed. This requires additional chip area in the implementation of the corresponding circuit and is therefore expensive.

Similar problems occur if the shortest possible hold time and a corresponding set-up time (which is longer than in the preceding case) are specified in each case for the circuit paths. This is referred to as the "best case".

SUMMARY

By way of introduction only, for checking a circuit path of a circuit for adherence to set-up and hold times, a timing behavior of the circuit path is classified as being correct if at least one pair of set-up and hold times from a plurality of pairs of set-up and hold times that are predefined for the circuit path does not produce any timing infringement, whereas the timing behavior of the circuit path is classified as being defective if each pair of set-up and hold times from the plurality of pairs of set-up and hold times produces a timing infringement.

If the circuit path to be checked does not place any stringent requirements on the set-up time, a pair with a relatively short hold time and a relative long set-up time, for example, may not produce any timing infringement, whereas for a circuit path in which a short set-up time is required, a pair with a short set-up time and a correspondingly longer hold time may not produce any timing infringement. This prevents the timing behavior of circuit paths from being detected as being defective, owing to unfavorable predefined set-up and hold times, and the circuit paths from accordingly being provided with additional buffers, despite the fact that in reality they do not have any timing problems.

The plurality of predefined pairs of set-up and hold times may be stored in a memory, or the pairs may be determined, during the checking of the circuit path, as a function of elements provided in the circuit path. The plurality of pairs may, in particular, contain one pair that specifies the shortest possible or minimum set-up time and a corresponding hold time for the circuit path, and one pair that specifies the shortest possible or minimum hold time with a corresponding set-up time for the circuit path. It is possible to interpolate between these extremes; however, it is also possible for further pairs, which are located between these extreme values, to be directly predefined or stored.

Operating parameters, such as temperature or voltages occurring in the circuit path, may be taken into account during the determination of the pairs.

For checking a circuit comprising a plurality of circuit paths to be checked, each of the circuit paths may be checked as described above. For systematic checking, it may in particular be checked, for each of the circuit paths to be checked, whether a first pair of set-up and hold times, for example a pair with the shortest possible set-up time and a corresponding hold time, produces a timing infringement. Only those circuit paths for which this first pair produces a timing infringement are checked with further pairs of the plurality of predefined set-up and hold times.

It should be noted that the plurality of predefined set-up and hold times is separately predefined for each circuit path as a function of the elements contained in the respective circuit path.

Also disclosed is a computer program product in the form of a computer-readable data carrier comprising a program code or electronically readable control signals for carrying out the method described in data processing equipment.

The foregoing summary has been provided only by way of introduction. Nothing in this section should be taken as a limitation on the following claims, which define the scope of the invention.

BRIEF DESCRIPTION OF THE FIGURE

The application will be described below in greater detail on the basis of preferred embodiments and with reference to the accompanying drawings, in which:

FIG. 5 is a flow chart of a method for determining a hold time, given a predefined set-up time;

FIG. 6 is a flow chart of a method for determining a set-up time, given a predefined hold time;

FIG. 7 is a flow chart of a preferred embodiment of a method according to the invention for checking a circuit for adherence to set-up and hold times;

FIG. 8 shows a further preferred embodiment of a method according to the invention for checking a circuit for set-up and hold times;

DETAILED DESCRIPTION

Figure 1:
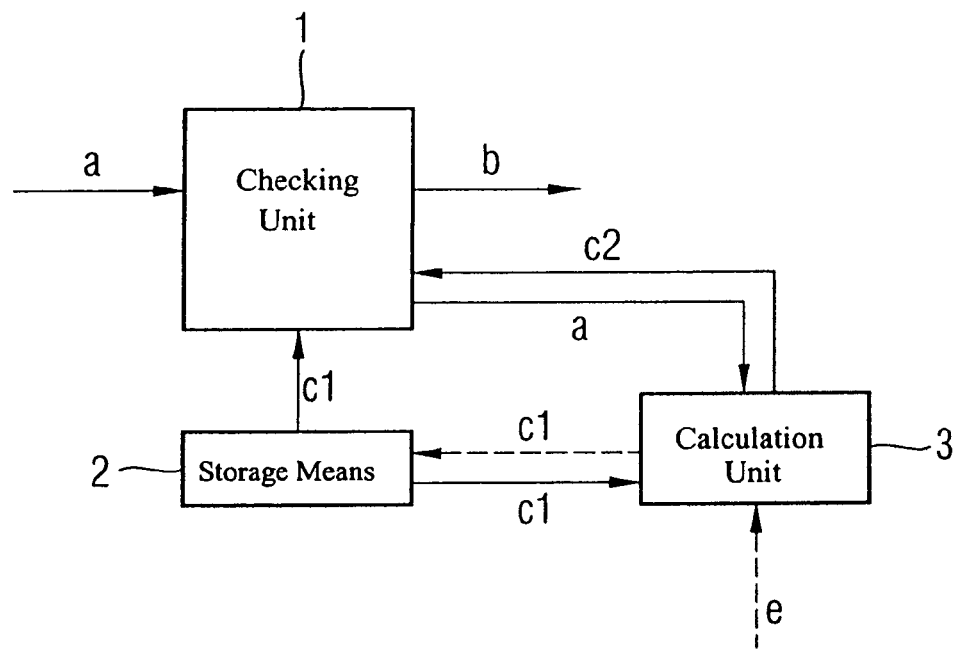
FIG. 1 is a block diagram of a device according to the invention.

FIG. 1 shows an embodiment of a device for checking a circuit for adherence to set-up and hold times. A machine-readable description a of the circuit to be checked is supplied to a checking unit 1. The machine-readable description a may, for example, be in the form of a NetList or in any other conventional description language. The circuit to be checked may, in particular, be an integrated circuit.

In the checking unit 1, circuit paths of the circuit described by the machine-readable description a are checked for adherence to set-up and hold times. Pairs of predefined admissible set-up and hold times c1 and/or c2 are used for this purpose. The pairs c1 are read out of storage means 2, while the pairs c2 are calculated using a calculation unit 3, as a function of the circuit description a. The pairs c2 may also be calculated as a function of the pairs c1 in that interpolation is carried out, for example, between the values for set-up and hold times from the pairs c1.

The stored pairs c1, which are stored in the storage means 2, may, in particular, be determined on the basis of specifications for circuit elements provided in the circuit paths of the circuit. This may take place, for example, by means of the calculation unit 3, which supplies these specifications as machine-readable specifications e. However, the pairs c1 may also be stored in the form of prefabricated libraries.

As a function of a result of the checking, the checking unit 1 issues checking parameters b, which specify whether and in which circuit paths of the circuit set-up and hold times are infringed. This information may then be used for modifying the circuit, for example by adding buffers.

The steps carried out in the checking unit 1 and the calculation unit 3 and the steps for determining the stored pairs c1 will be described below in greater detail with reference to corresponding flow charts.

Figure 2:
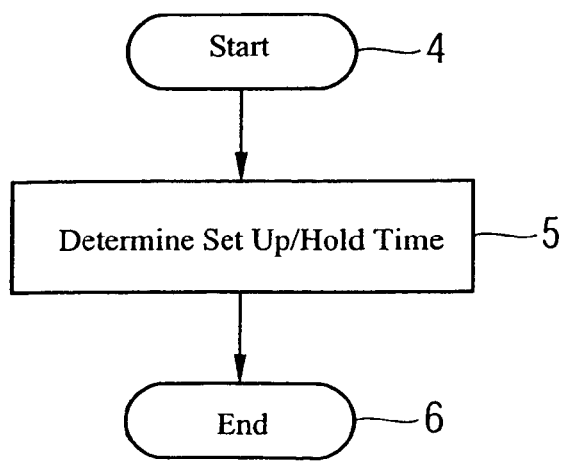
FIG. 2 is a flow chart for determining set-up and hold parameters.

FIG. 2 shows, in general, a method for determining pairs of set-up and hold parameters. At step 4, the method is started and the marginal conditions to be taken into account, such as, for example, voltages, process parameters such as a rapid or slow process, circuit parameters, load parameters, input parameters, temperature, etc., are detected. In step 5, a pair (S, H) of a set-up time S and a hold time H is determined for a given circuit path or a given circuit element, the method illustrated in FIG. 3 and/or the method illustrated in FIG. 4, which will be described below in greater detail, being, in particular, used. This expediently takes place for as many conceivable marginal conditions as possible, to which the circuit path or the circuit element may be exposed within the circuit, and, if possible, for all conceivable parameters under which each circuit path may operate. If it is ensured, during the subsequent checking in the checking unit 1, that the circuit to be checked functions correctly under all conceivable circumstances, checking of the least favorable conditions must be assumed.

Moreover, a plurality of values for the pairs (S, H) is generally possible for each circuit path, as the set-up and hold times are mutually dependent, i.e. if the set-up time is relatively short, a relatively long hold time is generally possible, and vice versa.

In step 6, the method from FIG. 2 is then completed.

Of the various pairs (S, H), the pair with the shortest possible set-up time S and the pair with the shortest possible hold time H are particularly interesting, as these two pairs form extreme values, between which other possible pairs (S, H) move.

Figure 3:
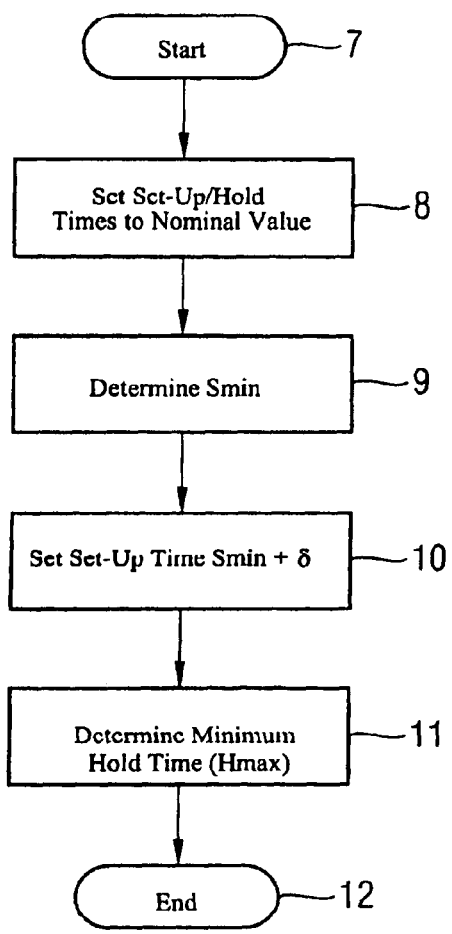
FIG. 3 is a flow chart for determining set-up and hold times with the shortest possible set-up time.

The method illustrated in FIG. 3, which is known as the "SH method", may be used for determining the pair (S, H) with the shortest possible set-up time. This "SH method" is started in step 7. In step 8, the set-up time S and the hold time H are set to nominal, very large values. Ideally, these nominal values are infinite or at least sufficiently large that a slight change in these values does not have any measurable effect on whether each circuit path operates correctly.

Figure 10:
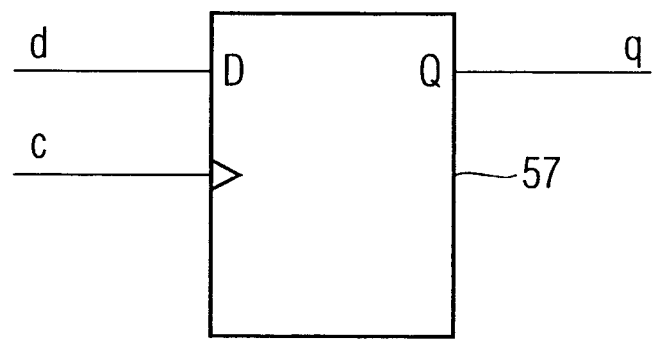
FIG. 10 shows a flip-flop.
Figure 11:
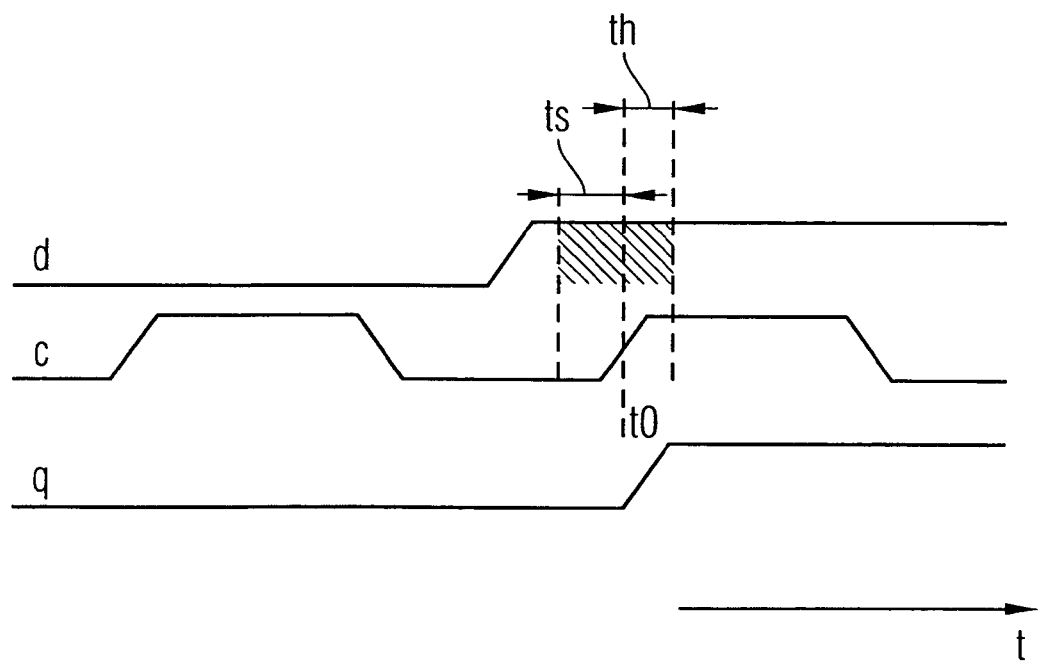
FIG. 11 is a timing diagram of the flip-flop from FIG. 10 for illustrating the terms "set-up time" and "hold time".

In step 9, a minimum value Smin is then determined, given the constant nominal value from step 8, with respect to a predefined failure criterion, for example by gradually reducing the set-up time S. This failure criterion may, for example, specify a limit as to how high the probability is that, given the values of S and H, the circuit path under consideration is not operating correctly. For the flip-flop described in the introduction to the description with reference to FIGS. 10 and 11, this failure criterion may, for example, specify that a proportion of defective scans of a data signal may not exceed a predefined value.

The value Smin thus determined in step 9 is the minimum possible set-up time for the circuit path under consideration, given the respectively used operating conditions, such as the temperature or operating voltage.

In step 10, the set-up time S is set to this value Smin plus a predefined tolerance value sup_gap, wherein this tolerance value may also be negative (S=Smin+sup_gap). The tolerance value thus allows either a "safety buffer" to be predefined or else the set-up time for the subsequent determination of a corresponding hold time to be extended somewhat, so that systematic errors may be compensated in the determination.

In step 11, the minimum hold time Hmax for the set-up time predefined in step 10 is then determined for a further predefined failure criterion. This further predefined failure criterion may be identical to the predefined failure criterion from step 9. However, a "softer" failure criterion is preferably used, in order to ensure convergence of the method. (Smin, Hmax) is then the desired pair with the minimum possible set-up time Smin.

In step 12, the method is then completed.

It should be noted that the determinations from steps 9 and 11 may be carried out both with the aid of a corresponding simulation of the circuit path—for example, using the calculation unit 3 from FIG. 1—and also by means of an actual measurement carried out on a circuit path that is implemented in terms of hardware.

It should also be noted that the designation "Hmax" is intended to indicate that the largest possible minimum hold time is produced for the smallest possible set-up time Smin that is predefined in the "SH method", whereas smaller values for the minimum possible hold time would be produced for longer set-up times.

Figure 4:
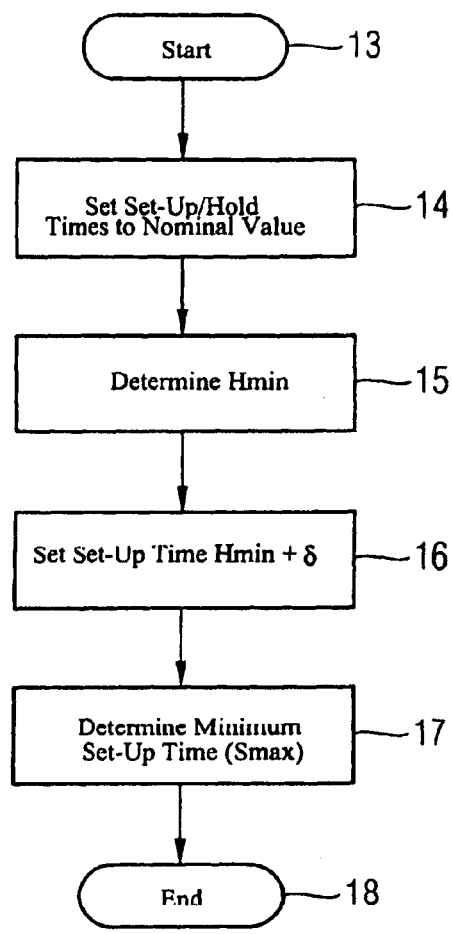
FIG. 4 is a flow chart of a method for determining set-up and hold times with the shortest possible hold time.

FIG. 4 shows a corresponding method for determining a pair (S, H) with the minimum possible hold time, also known as the "HS method". The method from FIG. 4 substantially corresponds to the method from FIG. 3, the roles of the set-up time and the hold time having been exchanged. The method is started in step 13. In step 14, the set-up time S and the hold time H are set to nominal values, which are as large as possible. Step 14 thus corresponds to step 8 from FIG. 3.

In step 15, a minimum possible value Hmin of the hold time is determined, given the nominal value of the set-up time, for a predefined failure criterion, for example the failure criterion of step 9 from FIG. 3, for example by successively reducing the hold time.

In step 16, the hold time H is set to the minimum possible hold time Hmin plus a tolerance value sup_gap, which has the same function as the tolerance value from step 10 of FIG. 3 (H=Hmin+sup_gap).

In step 17, a minimum possible set-up time Smax for the predefined failure criterion from step 15 is then determined for the hold time fixed in step 16. The pair (Smax, Hmin) is then the desired pair of the set-up and hold times, and the method is completed in step 18.

The SH method and the HS method produce two extreme values for a "set-up/hold window", in which a data signal, for example in the case of a flip-flop, may not exhibit any signal change. The SH method supplies a minimum possible set-up time with a correspondingly longer hold time, whereas the HS method supplies a minimum possible hold time with a correspondingly longer set-up time. Hmax>Hmin and Smax>Smin are therefore applicable.

FIGS. 5 and 6 are flow charts for determining a hold time, given a predefined set-up time ("H method", FIG. 5), or for determining a set-up time, given a predefined hold time ("S method", FIG. 6). These methods are a simplification of the methods from FIG. 3 and FIG. 4.

The "H method", which is illustrated in FIG. 5, is started in step 19. In step 20, the set-up time S is set to the desired predefined value. In step 21, the hold time is set to a nominal value, which is as large as possible and corresponds to the nominal value of steps 8, from FIGS. 3, and 14, from FIG. 4.

In step 22, the hold time is then gradually varied, for example reduced, in order to determine a minimum required hold time H for the predefined set-up time S, given a predefined value criterion corresponding to the criteria explained above. This determined minimum possible hold time is then the hold time pertaining to the predefined set-up time, and forms a pair (S, H) therewith.

In step 23, the H method is then completed. FIG. 6 shows the corresponding S method. The S method is started in step 24. In step 25, the hold time H is set to the respective desired, predefined value, and in step 26, the set-up time is set to a nominal value, which is as large as possible. In step 27, the minimum possible value of the set-up time, given the predefined hold time, is determined—for example, again, by gradually reducing the set-up time; the set-up time forms a desired pair (S, H) together with this predefined hold time. In step 28, the S method is then completed.

The methods from FIG. 5 and FIG. 6 may, in particular, be used to determine intermediate values for the pairs (Smin, Hmax) and (Smax, Hmin) determined by the methods from FIGS. 3 and 4. The set-up time S may, for example, gradually be increased from Smin to Smax and corresponding values of the hold time be determined by the H method, in order to form pairs (S, H), which are between the "extreme values" determined by the SH method and the HS method.

If these possible pairs are, for example, stored in the storage means 2 from FIG. 1, they may be used in the checking unit 1 from FIG. 1 to check a circuit for adherence to set-up and hold times. Possible methods will be described below, in this regard, with reference to FIG. 7 to 9.

FIG. 7 shows an embodiment of a method according to the invention for checking a circuit for adherence to set-up and hold times. The method is started in step 29. In step 30, conditions are established for the subsequent checking. These may, in particular, be operating conditions, such as the temperature or operating voltage. It is also established with which pair of values of the set-up and hold times the circuit paths to be checked of the circuit are initially checked. This may, for example, be the pair (Smax, Hmin) determined by the HS method.

In step 31, the timing behavior of all circuit paths to be checked is designated as being "not checked".

In step 32, all circuit paths to be checked are checked with the pair of set-up and hold times established for initial checking, in the present example (Smax, Hmin). The timing behavior of those circuit paths in which this checking does not produce any timing infringement, i.e. any set-up or hold infringement, is designated as being "checked", in other words as being correct.

In step 33, it is checked whether there is at least one circuit path to be checked, the timing behavior of which is designated as being "not checked". If this is the case (branch "J"), a circuit path, the timing behavior of which is designated as being "not checked", is selected in step 35, and in step 36 this circuit path is checked for other pairs (S, H) of set-up and hold times. The pair (Smin, Hmax) or intermediate values may, in particular, be used for this purpose. If it is established in step 37 that there is also a timing infringement in all of the pairs (S, H) used in step 36 (branch "J"), the timing behavior of this circuit path is designated in step 39 as being "defective". Otherwise (branch "N"), the timing behavior of this path is designated in step 38 as being "checked", as in this case there is no genuine timing infringement. Both step 38 and step 39 lead back to step 33. If, in step 33, it is finally established that no circuit paths to be checked are still designated as being "not checked" (branch "N"), the method is completed in step 34. In step 34, the timing behavior of all circuit paths to be checked is designated either as being "checked" or as being "defective". If there is no "defective" circuit path, the circuit has been completely checked with respect to the set-up and hold times, i.e. the circuit may be produced unmodified in this regard. If, on the other hand, there are "defective" circuit paths, said circuit paths have to be altered, for example by inserting buffers. After these alterations, the method is repeated in order to check whether the circuit is now error-free with respect to timing behavior.

The method illustrated in FIG. 7 is particularly suitable for circuit paths exhibiting long delays, in which a hold infringement may easily occur. This may take place, for example, in particular in the case of paths exhibiting a relatively low supply voltage or a relatively high clock frequency. It should be noted in this regard that, in the present example, the initial checking in step 32 is carried out with the shortest possible hold time Hmin. If infringements of the hold time occur, the timing behavior of these paths may also be directly designated as being "defective", as other values of the pair (S, H) exhibit a longer hold time, which is only then properly infringed.

For this additional query, FIG. 8 shows a more detailed flow chart, in particular for carrying out step 36 from FIG. 7. The method from FIG. 8 begins in step 40. In step 41, it is established, for the circuit path under consideration, that the set-up time of the pair (Smax, Hmin) determined by the HS method has been infringed, but the hold time has not been infringed (if, in this case, the hold time has already been infringed, the timing behavior of the circuit path under consideration may, as explained above, immediately be designated as being "defective").

In step 42, the circuit path under consideration is checked with the value pair (Smin, Hmax) obtained by the SH method, i.e. a maximum displacement of the SH window is carried out. In step 43, it is checked whether the set-up time is also infringed with the pair (Smin, Hmax). If this is the case (branch "J"), the timing behavior of the path under consideration is designated in step 50 as being "defective", as this means that the set-up time is infringed even with the smallest possible set-up time, so further attempts to find a possible pair (S, H) are futile. If this is not the case (branch "N"), it is checked in step 44 whether the hold time is infringed on use of the pair (Smin, Hmax). If, in step 45, it is then established that this is not the case (branch "N"), the timing behavior of the circuit path under consideration is designated in step 49 as "checked", as there is no actual timing infringement. If the hold time is infringed (branch "J"), an optimal pair (S, H) is determined in step 46. For this purpose, the set-up time is, for example, increased until a maximum possible set-up time for the case under consideration, at which the set-up time is not infringed, has been determined, in order then to determine a corresponding hold time by the H method from FIG. 5. In step 47, the circuit path under consideration is checked with the pair (S, H) determined in step 46, in which pair there is no set-up infringement. In step 48, it is then decided whether there is still a hold infringement for this pair (S, H). If this is the case (branch "J"), the timing behavior of the circuit path under consideration is designated in step 50 as being "defective"; if this is not the case (branch "N"), the timing behavior of the path under consideration is designated as being "checked". After step 49 or after step 50, the examination of the path under consideration is completed in step 51.

Figure 9:
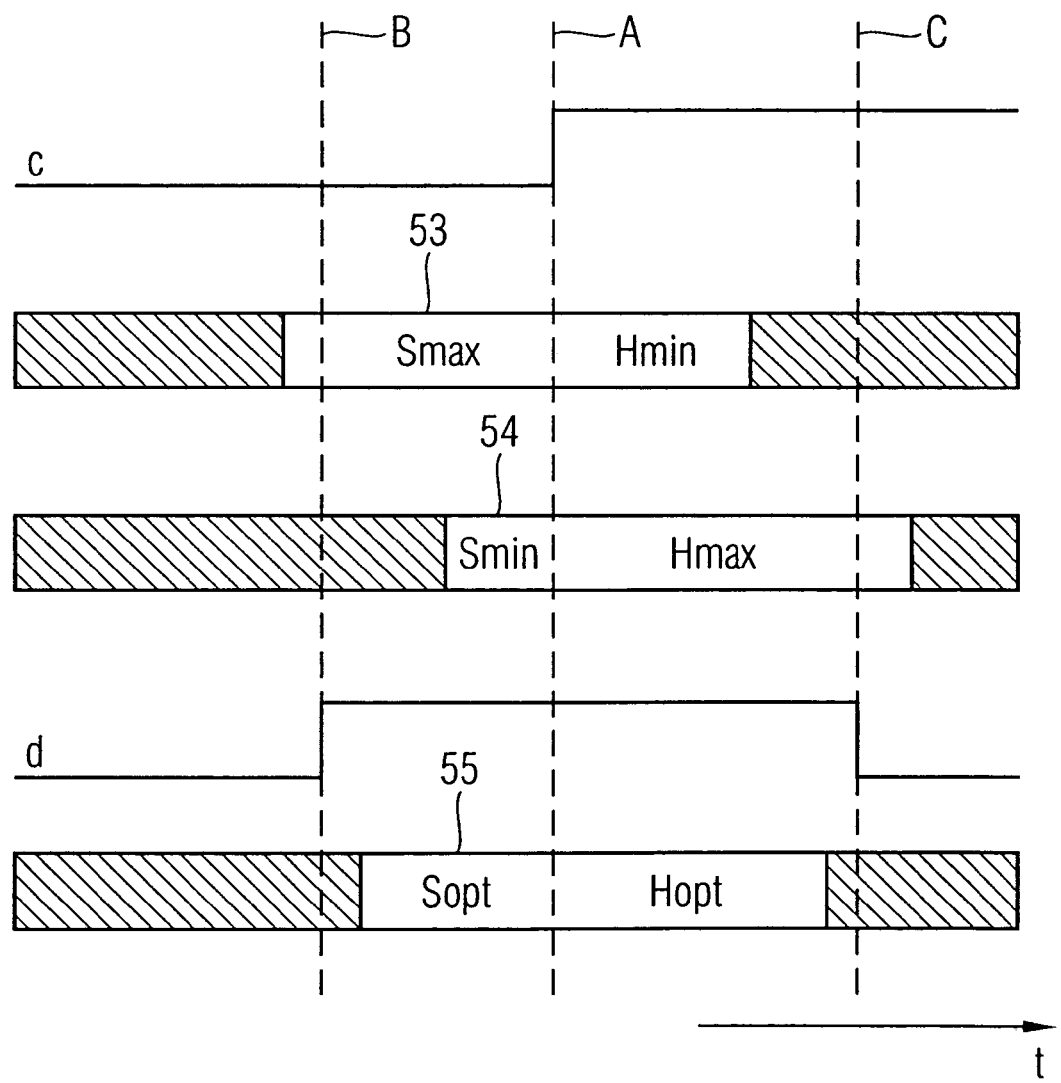
FIG. 9 is a timing diagram for illustrating the method from FIG. 8.

FIG. 9 shows timing diagrams in order to illustrate the method from FIG. 8. The flip-flop 57 from FIG. 10, which was described in the introduction to the description and comprises a data input D for a data signal d and a clock input for a clock signal c, may be taken as an example of a circuit path under consideration. The top line of FIG. 9 shows an exemplary clock signal c, while the fourth line shows an exemplary data signal d. The data signal d of the flip-flop is scanned at the rising edge of the clock signal c, i.e. during the exchange of the value of the clock signal c, which is denoted by the broken line A.

As described above the pair, (Smax, Hmin), which is determined by the HS method, is initially used for checking the timing behavior. The corresponding SH window is denoted in FIG. 9 by reference numeral 53 and delimited by blocks with black shading. The portion of the SH window 53 to the left of line A in FIG. 9 represents the set-up time Smax and the portion to the right of line A represents the hold time Hmin. As the state of the data signal d changes within the set-up time Smax, as illustrated by the broken line B, there is in this case a set-up infringement. On the other hand, there is no hold infringement. In accordance with step 42 from FIG. 8, the circuit portion under consideration is then checked with the pair (Smin, Hmax). FIG. 9 also shows a corresponding SH window 54. In this case, there is no longer any set-up infringement. Nevertheless, the state of the data signal d now changes during the hold time Hmax, as denoted by the broken line C. In this case, there is therefore now a hold infringement.

In step 47, a set-up time Sopt at which there is no set-up infringement, but which is nevertheless as large as possible, is determined by successively increasing the set-up time, starting from the value Smin. It is accordingly advisable to maintain a given "safety distance" from the change of state of the data signal d denoted by the line B. A corresponding hold time Hopt is calculated for this set-up time Sopt. A corresponding SH window is denoted by reference numeral 55 in FIG. 9. As may be seen, the state of the data signal d does not change either during the set-up time Sopt or during the hold time Hopt, so there is in this case neither a set-up infringement nor a hold infringement. As the corresponding circuit path may be operated with the path (Sopt, Hopt), operation of the circuit path with the predefined clock signal c and the predefined data signal d is possible. The corresponding circuit path may accordingly be designated as being "checked".

The device illustrated in FIG. 1 for carrying out the corresponding methods illustrated in FIG. 2 to 8 is preferably configured within a computer program for designing, in particular, integrated circuits on data processing equipment. In comparison to existing EDA programs, such as are described in the introduction to the description, at least the two borderline cases of the set-up and hold times, i.e. the pairs (Smin, Hmax) and (Smax, Hmin), are in this case stored in a library ("VLSI Design Library"), which is provided by the storage means 2 from FIG. 1. The EDA program then at least checks whether one of these two combinations of the set-up and hold times does not produce any infringement, and optionally selects the more favourable combination. More pairs (S, H) of the set-up and hold times may also be stored in the library, and/or interpolation may be carried out, as described with reference to FIG. 8, between the pairs stored in the library.

Existing EDA programs may also be used. As explained above, in the case of existing EDA programs, only one pair of set-up and hold times can be predefined, in each case, for each circuit path, and this may in turn take place in a corresponding library. Two separate libraries are therefore preferably created for performing the steps shown, the first of the two libraries comprising, for example, the pairs (Smin, Hmax) for each circuit path and the second library comprising the pairs (Smax, Hmin) for each circuit path. The circuit is now firstly checked with the first library. The circuit paths for which a "defective" timing behavior is produced are stored in a file, for example by means of a script. The EDA program is then restarted with the second library, only those circuit paths that are denoted in the file as being "defective" now being checked. The circuit paths that do not exhibit any defective timing behavior during this second execution of the program are then not processed in a subsequent "hold time fixing", i.e. during subsequent revision of the circuit paths, in order to correct set-up/hold infringements. Although this solution does not allow any interpolation between predefined values, superfluous "hold time fixings", and thus silicon area, may nevertheless be saved.

The methods specified above are to be regarded merely as embodiments, which may be varied in a wide variety of manners. The embodiment from FIG. 8 is, in particular, especially suitable for circuit paths in which hold infringements frequently occur. If it may be foreseen, owing to the conditions in the circuit, that set-up infringements may primarily occur in the circuit paths to be checked, the circuit paths may initially be checked with the path (Smin, Hmax), so circuit paths that exhibit a set-up infringement even at a minimum set-up time may immediately be designated as being "defective". In this respect, it is conceivable to allocate labels, which specify with which pair (S, H) a first checking is to be carried out, to each of the various circuit paths.

It is therefore intended that the foregoing detailed description be regarded as illustrative rather than limiting, and that it be understood that it is the following claims, including all equivalents, that are intended to define the spirit and scope of this invention. Nor is anything in the foregoing description intended to disavow scope of the invention as claimed or any equivalents thereof.

The invention claimed is:

1. A method for checking a circuit path of a circuit for adherence to set-up and hold times, the method comprising:
  determining minimum and maximum set-up and hold times from a plurality of set-up and hold times for the circuit path with respect to predefined failure criteria,
  wherein the determining minimum and maximum set-up and hold times is performed by data processing equipment;
  designating the timing behavior of the circuit path as being defective if a set-up timing infringement exists using the minimum set-up time or a hold timing infringement exists using the minimum hold time; and
  if neither the set-up timing infringement exists using the minimum set-up time or the hold timing infringement exists using the minimum hold time, designating the timing behavior of the circuit path as being correct if no timing infringement exists using a set-up time between the minimum and maximum set-up times and using a hold time between the minimum and maximum hold times;
  selecting a first pair of the maximum set-up time and the minimum hold time and a second pair of the minimum set-up time and the maximum hold time;
  determining whether set-up and hold timing infringement in the circuit path exists using the first pair and using the second pair, respectively;
  if set-up or hold timing infringement exists using the first or second pair:
    decreasing the set-up time if set-up timing infringement exists using the first pair to the larger of: a set-up time at which no timing infringement exists or the minimum set-up time,
    decreasing the hold time if hold timing infringement exists using the second pair to the larger of: a hold time at which no timing infringement exists or the minimum hold time,
    selecting the set-up time decreased to plus a first small amount as a set-up time to use for the circuit path if no set-up timing infringement exists as the set-up time has decreased and selecting the hold time decreased to plus a second small amount as a hold time to use for the circuit path if no hold timing infringement exists as the hold time has decreased, and
  designating the timing behavior of the circuit path as being correct if no timing infringement exists using either the first or second pair of set-up and hold times.

2. The method according to claim 1, further comprising adjusting the set-up and hold times as a function of operating conditions of the circuit.

3. The method according to claim 2, wherein the operating conditions of the circuit include at least one of an operating temperature of the circuit, a process temperature of the circuit, or a supply voltage of the circuit.

4. The method according to claim 1, wherein the same criterion is used to define at least one of the pair of the maximum set-up time and the minimum hold time or the pair of the minimum set-up time and the maximum hold time.

5. The method according to claim 1, wherein different criterion is used to define at least one of the pair of the maximum set-up time and the minimum hold time or the pair of the minimum set-up time and the maximum hold time.

6. A device for checking a circuit path of a circuit for adherence to set-up and hold times, the device comprising:
  data processing equipment that determines minimum and maximum set-up and hold times for the circuit path with respect to predefined failure criteria;
  wherein the data processing equipment designates the timing behavior of the circuit path as being defective if a set-up timing infringement exists using the minimum set-up time or a hold timing infringement exists using the minimum hold time;

if neither the set-up timing infringement exists using the minimum set-up time or the hold timing infringement exists using the minimum hold time, the data processing equipment designating the timing behavior of the circuit path as being correct if no timing infringement exists using a set-up time between the minimum and maximum set-up times and using a hold time between the minimum and maximum hold times;

the data processing equipment selecting a first pair of the maximum set-up time and the minimum hold time and a second pair of the minimum set-up time and the maximum hold time;

the data processing equipment determining whether set-up and hold timing infringement in the circuit path exists using the first pair and using the second pair, respectively;

if set-up or hold timing infringement exists using the first or second pair:

the data processing equipment decreasing the set-up time if set-up timing infringement exists using the first pair to the larger of: a set-up time at which no timing infringement exists or the minimum set-up time, the data processing equipment decreasing the hold time if hold timing infringement exists using the second pair to the larger of: a hold time at which no timing infringement exists or the minimum hold time, the data processing equipment selecting the set-up time decreased to plus a first small amount as a set-up time to use for the circuit path if no set-up timing infringement exists as the set-up time has decreased and selecting the hold time decreased to plus a second small amount as a hold time to use for the circuit path if no hold timing infringement exists as the hold time has decreased, and the data processing equipment designating the timing behavior of the circuit path as being correct if no timing infringement exists using either the first or second pair of set-up and hold times.

* * * * *